(12) United States Patent
Shi

(10) Patent No.: US 10,133,409 B2
(45) Date of Patent: Nov. 20, 2018

(54) ARRAY SUBSTRATE METHOD FOR FABRICATING THE SAME, TOUCH PANEL

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Dawei Shi, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/574,115

(22) PCT Filed: Mar. 3, 2017

(86) PCT No.: PCT/CN2017/075549
§ 371 (c)(1),
(2) Date: Nov. 14, 2017

(87) PCT Pub. No.: WO2017/197958
PCT Pub. Date: Nov. 23, 2017

(65) Prior Publication Data
US 2018/0239485 A1 Aug. 23, 2018

(30) Foreign Application Priority Data
May 20, 2016 (CN) .......................... 2016 1 0342304

(51) Int. Cl.
*G06F 3/041* (2006.01)
*H01L 27/12* (2006.01)
(Continued)

(52) U.S. Cl.
CPC ............ *G06F 3/0416* (2013.01); *G06F 3/044* (2013.01); *G06F 3/047* (2013.01); *H01L 27/1259* (2013.01); *G02F 2201/123* (2013.01)

(58) Field of Classification Search
CPC combination set(s) only.
See application file for complete search history.

(56) References Cited

U.S. PATENT DOCUMENTS

2014/0361786 A1  12/2014  Yao et al.
2016/0291758 A1  10/2016  Du et al.

FOREIGN PATENT DOCUMENTS

CN    103927038 A    7/2014
CN    104461142 A    3/2015
(Continued)

OTHER PUBLICATIONS

International Search Report and Written Opinion in PCT/CN2017/075549 dated May 31, 2017, with English translation.

*Primary Examiner* — Robin Mishler
(74) *Attorney, Agent, or Firm* — Womble Bond Dickinson (US) LLP

(57) ABSTRACT

An array substrate, a fabricating method thereof and a touch panel are disclosed. The array substrate comprises a TFT, a common electrode layer, a touch line, a touch connection terminal and a connection electrode. The touch connection terminal and the touch line are arranged in different layers. The connection electrode comprises a first connection electrode arranged in a same layer as the touch line and a second connection electrode arranged in a same layer as the common electrode layer. The touch line is connected with the touch connection terminal through the first connection electrode, and the common electrode layer is connected with the touch connection terminal through the second connection electrode. The common electrode layer is connected indirectly with the touch line through the touch connection (Continued)

terminal. This reduces resistance between the common electrode layer and the touch line, and avoids defects in display and touch control.

18 Claims, 3 Drawing Sheets

(51) Int. Cl.
*G06F 3/044* (2006.01)
*G06F 3/047* (2006.01)

(56) References Cited

FOREIGN PATENT DOCUMENTS

| | | |
|---|---|---|
| CN | 104699316 A | 6/2015 |
| CN | 204595383 U | 8/2015 |
| CN | 106020545 A | 10/2016 |
| KR | 20160035195 A | 3/2016 |

ARRAY SUBSTRATE METHOD FOR FABRICATING THE SAME, TOUCH PANEL

RELATED APPLICATIONS

The present application is the U.S. national phase entry of PCT/CN2017/075549, with an international filing date of Mar. 3, 2017, which claims the benefit of Chinese Patent Application No. 201610342304.5, filed on May 20, 2016, the entire disclosures of which are incorporated herein by reference.

TECHNICAL FIELD

The present disclosure relates to the field of display technology, and particularly to an array substrate, a method for fabricating the same, and a touch panel.

BACKGROUND

A touch panel is also referred to as a touch control panel, and has been widely applied in various electronic products and accepted by customers. Therefore, endeavor has been made in the art to improve the touch panel display technique in order to produce better user experience.

The existing built-in capacitive touch panel can be divided into On-Cell touch panel and In-Cell touch screen. In-Cell touch screen can be further divided into Hybrid In-Cell (HIC) capacitive touch panel and Full In-Cell (FIC) capacitive touch panel.

SUMMARY

An embodiment of the present disclosure provides an array substrate, comprising a thin film transistor (TFT), a common electrode layer, a touch line, a touch connection terminal, and a connection electrode. The touch connection terminal and the touch line are arranged in different layers. The connection electrode comprises a first connection electrode which is arranged in a same layer as the touch line and a second connection electrode which is arranged in a same layer as the common electrode layer. The touch line is connected with the touch connection terminal through the first connection electrode, and the common electrode layer is connected with the touch connection terminal through the second connection electrode.

For example, the array substrate further comprises an auxiliary connection terminal which extends from a side of the touch line. The auxiliary connection terminal is arranged in a same layer as the touch line, the auxiliary connection terminal is connected with the touch connection terminal through the first connection electrode. The auxiliary connection terminal at least partially overlaps with the touch connection terminal.

For example, the array substrate further comprises a first insulating layer which is arranged between the common electrode layer and the touch connection terminal and a second insulating layer which is arranged on the first insulating layer. The touch line and the auxiliary connection terminal are arranged between the first insulating layer and the second insulating layer. The first insulating layer is provided with a first via in a region corresponding with a position where the auxiliary connection terminal and the touch connection terminal overlap, and the first connection electrode is arranged in the first via. The first insulating layer is provided with a second via in a region corresponding with a position where the touch connection terminal and the auxiliary connection terminal do not overlap, the second insulating layer is provided with a third via, the second via at least partially overlaps with the third via, and the second connection electrode is arranged in the second via and the third via.

For example, the second via and the third via are concentrically arranged.

For example, the first via, the second via, and the third via are tapered holes, and the tapered holes have an aperture which gradually decreases in a direction away from the touch connection terminal.

For example, the second via has a maximum aperture smaller than or equal to a minimum aperture of the third via.

For example, a portion of the touch connection terminal does not overlap with the touch line.

For example, the touch connection terminal and the touch line do not overlap with each other.

For example, the array substrate further comprises a data line. The data line is arranged in a same layer as the touch line, and the data line is arranged in such a manner that it is parallel with and spaced apart from the touch line.

For example, the thin film transistor comprises a gate electrode, a gate insulating layer, an active layer, and a source and drain electrode which are arranged in this order, and the touch line is arranged in a same layer as the source and drain electrode.

For example, the touch connection terminal is arranged in a same layer as the gate electrode.

For example, the touch line and the source and drain electrode have a tri-layer structure which is made from titanium, aluminum, and titanium in this order.

For example, the gate electrode and the touch connection terminal are made from molybdenum.

An embodiment of the present disclosure further provides a touch panel, which comprises the array substrate as described above.

An embodiment of the present disclosure further provides a method for fabricating an array substrate, comprising:

forming a pattern comprising a touch connection terminal;

depositing a first insulating layer on the touch connection terminal, and forming a first via and a second via in the first insulating layer;

forming a pattern comprising a touch line and a first connection electrode on the first insulating layer, wherein the first connection electrode is arranged in the first via;

depositing a second insulating layer on the first insulating layer on which the pattern comprising the touch line and the first connection electrode has been formed, and forming a third via in the second insulating layer, wherein the third via at least partially overlaps with the second via; and forming a pattern comprising a common electrode layer and a second connection electrode on the second insulating layer, wherein the second connection electrode is arranged in the second via and the third via, and the second connection electrode connects the common electrode layer with the touch connection terminal.

For example, the step of forming the pattern comprising the touch line and the first connection electrode on the first insulating layer further comprises: forming an auxiliary connection terminal which extends from a side of the touch line, wherein an orthographic projection of the auxiliary connection terminal at least partially overlaps with the first via, the auxiliary connection terminal forms a first connection electrode in the first via, and the auxiliary connection terminal is connected with the touch connection terminal through the first connection electrode.

For example, the step of forming the pattern comprising the touch connection terminal comprises: forming a pattern comprising the touch connection terminal and a gate electrode in a same patterning process.

For example, the step of forming the pattern comprising the touch line and the first connection electrode on the first insulating layer comprises: forming a pattern comprising the touch line, the first connection electrode, and a source and drain electrode in a same patterning process.

For example, the first via, the second via, and the third via are tapered holes, the tapered holes have an aperture which gradually decreases in a direction away from the touch connection terminal, and the second via has a maximum aperture smaller than or equal to a minimum aperture of the third via.

For example, the touch line and the source and drain electrode have a tri-layer structure which is made from titanium, aluminum, and titanium in this order, and the touch connection terminal is made from molybdenum.

The touch panel and the method for fabricating the array substrate of the present disclosure have similar or identical embodiments with the array substrate as described above, and thus have similar or identical advantages and beneficial effects.

DETAILED DESCRIPTION OF EMBODIMENTS

Figure 1:
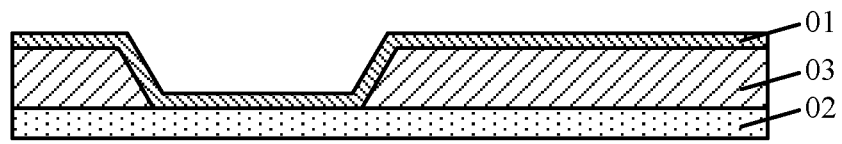
FIG. 1 is a partial cross-sectional view for illustrating an existing array substrate.

The present disclosure will be described hereinafter in detail in conjunction with drawings and embodiments, for purpose that the skilled in the art can better understand technical solutions of the present disclosure.

Reference numerals: 01 common electrode layer; 02 connection layer; 03 insulating layer; 1 common electrode layer; 4 touch line; 5 first connection electrode; 6 second connection electrode; 7 touch connection terminal; 7' gate electrode; 8 first insulating layer; 9 second insulating layer; 10 auxiliary connection terminal; 10' source and drain electrode; 11 first via; 12 second via; 13 third via; 14 data line.

In a FIC capacitive touch panel, a connection structure between a common electrode layer and a touch line connect in an array substrate is shown in FIG. 1. An insulating layer 03 is arranged between a common electrode layer 01 and a connection layer 02 of the touch line. The insulating layer 03 is provided with a via. The common electrode layer 01 is connected with the connection layer 02 through the via, to realize a connection between the common electrode layer 01 and the touch line. In a low-temperature polycrystalline silicon process, the connection layer 02 is arranged in a same layer as a source and drain electrode of the thin film transistor, and is made from Ti/Al/Ti tri-layer metal structure of low resistivity.

Inventors found that the above capacitive touch panel at least suffers from the following problems. The connection layer 02 of the touch line is made from a tri-layer metal structure of Ti/Al/Ti. In a plasma-containing environment, or when transferred from a high temperature environment to a low temperature environment, Ti will be oxidized into titanium oxide. Titanium oxide is attached onto a surface of the connection layer 02 and significantly increases the contact resistance between the common electrode layer 01 and the connection layer 02. This leads to defects in display and touch control. Furthermore, titanium oxide attached onto the surface of the connection layer 02 is water insoluble and is difficult to remove.

Figure 2:
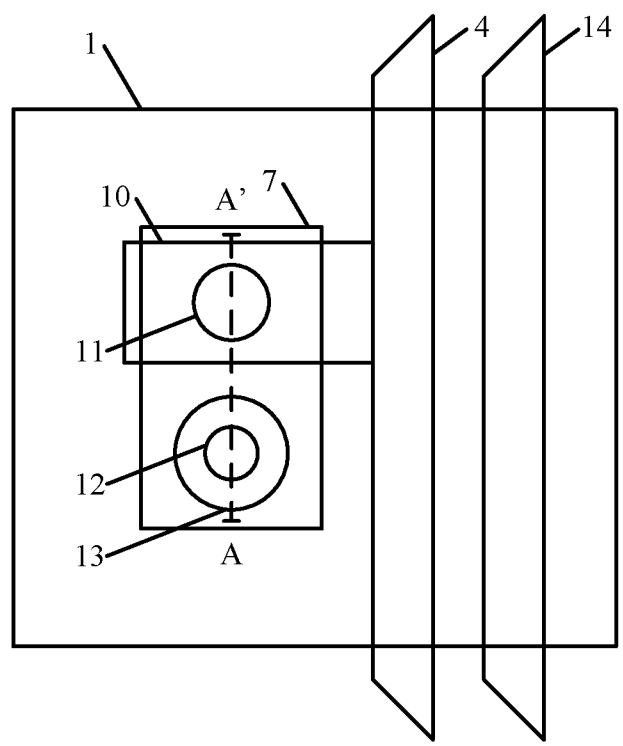
FIG. 2 is a local perspective view for illustrating an array substrate in an embodiment of the present disclosure.
Figure 3:
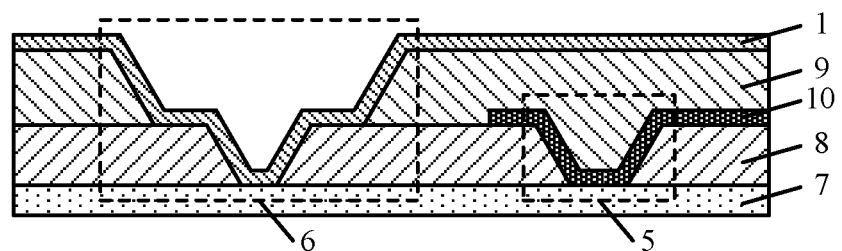
FIG. 3 is a partial cross-sectional view for illustrating an array substrate in an embodiment of the present disclosure.

An embodiment of the present disclosure provides an array substrate. FIG. 2 is a perspective view for the array substrate of the present embodiment, and FIG. 3 is a partial cross-sectional view of the array substrate along a line A-A' in FIG. 2. As shown in FIG. 2 and FIG. 3, the array substrate comprises a thin film transistor, and a common electrode layer 1 and a touch line 4 on the thin film transistor. The array substrate further comprises a touch connection terminal 7. The touch connection terminal 7 is arranged in a different layer from that of the touch line 4. The touch line 4 is connected with the common electrode layer 1 through a connection electrode. The connection electrode comprises a first connection electrode 5 and a second connection electrode 6. The touch line 4 is connected with the touch connection terminal 7 through the first connection electrode 5. The common electrode layer 1 is connected with the touch connection terminal 7 through the second connection electrode 6. In this way, the common electrode layer 1 is connected indirectly with the touch line 4 through the touch connection terminal 7, and this can significantly reduce the contact resistance between the common electrode layer 1 and the touch line 4.

At least a portion of the touch connection terminal 7 does not overlap with the touch line 4.

In an embodiment, a portion of the touch connection terminal 7 dose not overlap with the touch line 4. In this case, a portion of the touch connection terminal 7 dose not overlap with the touch line 4, while the remaining portion of the touch connection terminal 7 overlaps with the touch line 4. The expression "A overlaps with B" indicates a projection of A in a direction perpendicular with a plane where the array substrate lies overlaps with that of B.

In an embodiment, the touch connection terminal 7 and the touch line 4 do not overlap with each other. Namely, the projection of the touch connection terminal 7 in the direction perpendicular with the plane where the array substrate lies does not overlap with that of the touch line 4. This is advantageous, because it is not necessary to modify the existing touch line 4 and thus the touch line 4 will not be affected, during arranging the touch connection terminal 7 and realizing the electrical connection between the touch connection terminal 7 and the touch line 4. This further controls the complexity of process and ensures the touch control performance of the touch line.

Figure 5A:
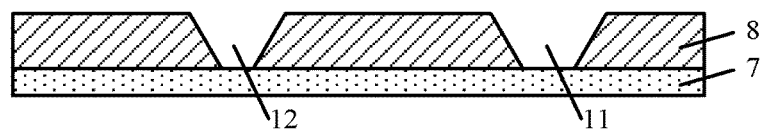
FIG. 5A, FIG. 5B, FIG. 5C and FIG. 5D are partial cross-sectional views corresponding to the process for the array substrate shown in FIG. 3.

In an example, a first insulating layer 8 and a second insulating layer 9 thereon are arranged between the common electrode layer 1 and the touch connection terminal 7. The touch line 4 is arranged between the first insulating layer 8 and the second insulating layer 9. The touch line 4 extends from a side to form an auxiliary connection terminal 10. The auxiliary connection terminal 10 at least partially overlaps with the touch connection terminal 7, i.e., they at least partially overlap with each other in the orthographic projection direction (in the direction perpendicular to the plane where the array substrate lies). The first insulating layer 8 is provided with a first via 11 in a region corresponding with a position where the auxiliary connection terminal 10 overlaps with the touch connection terminal 7 (as shown in FIG. 5A), and the first connection electrode 5 is arranged in the first via 11. The first insulating layer 8 is provided with a second via 12 in a region corresponding with a place where the touch connection terminal 7 does not overlap with the auxiliary connection terminal 10 (as shown in FIG. 5A). The second insulating layer 9 is provided with a third via 13 which is concentrically arranged with respect to the second via 12 (as shown in FIG. 5C). The second connection electrode 6 is arranged in the second via 12 and the third via 13. In this way, the common electrode layer 1 is connected with the touch connection terminal 7 through the second connection electrode 6, and the auxiliary connection terminal 10 is also connected with the touch connection terminal 7 through the first connection electrode 5, so that the common electrode layer 1 and the auxiliary connection terminal 10 are connected indirectly. Moreover, the auxiliary connection terminal 10 is connected to the touch line 4, so that the contact resistance between the common electrode layer 1 and the touch line 4 is significantly reduced.

In an exemplary embodiment, for purpose of simplifying the formation of the first connection electrode 5 and the second connection electrode 6 and forming a stable structure, the first via 11, the second via 12, and the third via 13 are tapered holes. The second via 12 has a maximum aperture smaller than or equal to that of the third via 13. In this way, during forming the pattern comprising the touch line 4 and the auxiliary connection terminal 10, the first connection electrode 5 with a stable structure is formed. As compared with the existing array substrate, the number of patterning processes is not increased, and a stable connection between the auxiliary connection terminal 10 and the touch connection terminal 7 is formed. Similarly, during forming the pattern comprising the common electrode layer 1, the second connection electrode 6 with a stable structure can be formed simultaneously. As compared with the existing array substrate, the number of patterning processes is not increased, and a stable connection between the common electrode layer 1 and the touch connection terminal 7 is formed.

The thin film transistor comprises a gate electrode, a gate insulating layer, an active layer, and a source and drain electrode which are arranged in this order. The touch line 4 is arranged in a same layer as the source and drain electrode, and the touch connection terminal 7 is arranged in a same layer as the gate electrode. In this way, a pattern comprising the touch line 4 and source and drain electrode can be formed in a same patterning process, and a pattern comprising the touch connection terminal 7 and the gate electrode can be formed in a same patterning process. As compared with the existing array substrate, the number of patterning processes is not increased.

The array substrate of the present embodiment further comprises a data line 14. The data line 14 is arranged in a same layer as the touch line 4. The data line 14 is parallel with and spaced apart from the touch line 4. In this way, the data line 14 and the touch line 4 can be formed in a same patterning process, and the number of patterning processes is not increased.

Moreover, the touch line 4, the auxiliary connection terminal 10, and the source and drain electrode have a tri-layer structure. The tri-layer structure is made from titanium, aluminum, and titanium in this order. The gate electrode and the touch connection terminal 7 are made from molybdenum. Since the touch connection terminal 7 is made from molybdenum, the contact resistance between the touch connection terminal 7 and the first and second connection electrode 5, 6 is relatively low. As compared with the direct contact between the common electrode layer 1 and the connection layer 2 of the touch line in the existing array substrate, the resistance between the common electrode layer 1 and the touch line 4 can be significantly reduced, which avoid defects in display and touch control.

In the array substrate of the present embodiment, the auxiliary connection terminal 10 of the touch line 4 is connected indirectly with the common electrode layer 1 through the first connection electrode 5, the touch connection terminal 7 and the second connection electrode 6 in this order. Therefore, the resistance between the touch line 4 and the common electrode layer 1 is reduced, which avoid defects in display and touch control. In addition, the touch connection terminal 7 is arranged in a same layer as the gate electrode, and the touch line 4 is arranged in a same layer as the source and drain electrode. Therefore, as compared with the existing array substrate, the array substrate of the present embodiment neither increases the number of patterning processes, nor increases the production cost.

Figure 4:
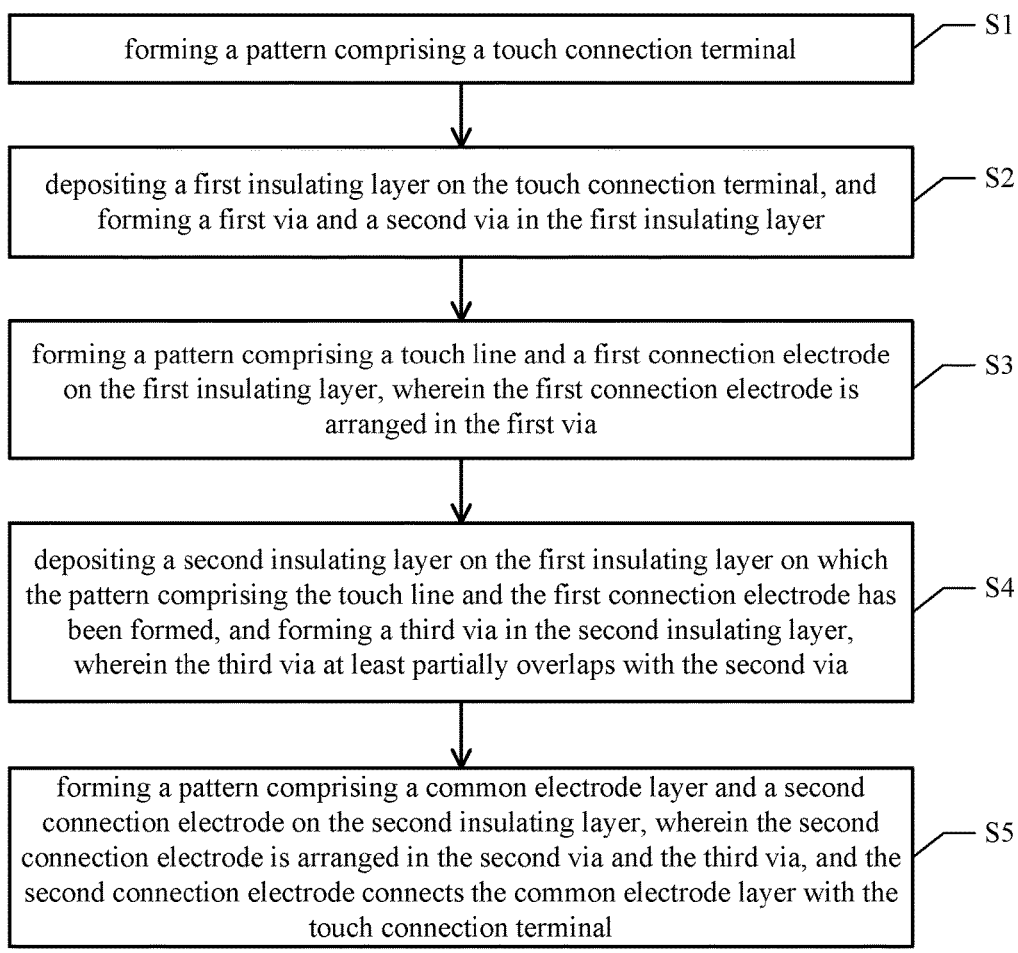
FIG. 4 is a flow chart for illustrating a method for fabricating an array substrate in an embodiment of the present disclosure.

An embodiment of the present disclosure provides a method for fabricating an array substrate, which is applied to fabricate the array substrate as described above. FIG. 4 is a flow chart for illustrating a method for fabricating an array substrate in the present embodiment. As shown in FIG. 4, the method comprises steps of:

S1, forming a pattern comprising a touch connection terminal;

S2, depositing a first insulating layer on the touch connection terminal, and forming a first via and a second via in the first insulating layer;

S3, forming a pattern comprising a touch line and a first connection electrode on the first insulating layer, wherein the first connection electrode is arranged in the first via;

S4, depositing a second insulating layer on the first insulating layer on which the pattern comprising the touch line and the first connection electrode has been formed, and forming a third via in the second insulating layer, wherein the third via at least partially overlaps with the second via; and S5, forming a pattern comprising a common electrode layer and a second connection electrode on the second insulating layer, wherein the second connection electrode is arranged in the second via and the third via, and the second connection electrode connects the common electrode layer with the touch connection terminal.

Steps S1-S5 will be described hereinafter with reference to FIGS. 5A-5D.

In step S1, a pattern comprising the touch connection terminal 7 is formed.

For example, this step further comprises forming a pattern comprising the gate electrode in a same patterning process from a same layer. Namely, the pattern comprising the gate electrode of thin film transistor is formed by a same patterning process from a same layer as the pattern comprising the touch connection terminal 7. As compared with the existing process for fabricating an array substrate, although the touch connection terminal 7 is additionally formed in this step, the number of patterning processes is not increased. The touch connection terminal 7 can have a shape of rectangle, circle, ellipse, or the like, provided that the touch connection terminal 7 has a sufficient size for contacting both the first and second connection electrode which will be formed subsequently.

Moreover, the gate electrode and the touch connection terminal 7 are made from molybdenum, so that the resistance is low.

In step S2, the first insulating layer 8 is formed on the touch connection terminal 7, and the first insulating layer 8 is provided with a first via and second via.

As shown in FIG. 5A, both the first and second via 11, 12 are tapered holes. An opening close to the touch connection terminal 7 (bottom opening) has an aperture smaller than that of an opening away from the touch connection terminal 7 (top opening). As shown in FIG. 5A, in an example, the first via 11 and the second via 12 have an aperture which gradually decreases in a direction away from the touch connection terminal 7. This facilitates forming electrodes in the first via 11 and the second via 12.

In step S3, a pattern comprising the touch line 4 and the auxiliary connection terminal 10 which extends from a side of the touch line 4 is formed on the first insulating layer 8. An orthographic projection of the auxiliary connection terminal 10 at least partially overlaps with the first via 11. The first connection electrode 5 is formed in the first via 11. The first connection electrode 5 connects the auxiliary connection terminal 10 with the touch connection terminal 7.

Figure 5B:
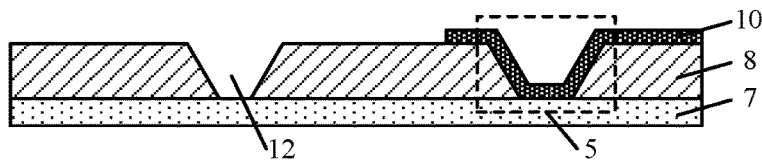
Figure 5C:
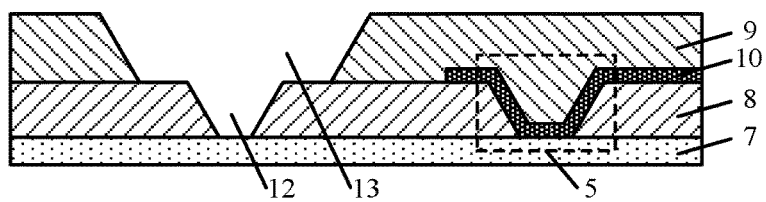

As shown in FIG. 5B, in this step, a pattern comprising the touch line 4, the auxiliary connection terminal 10, the first connection electrode 5 is formed in a same patterning process, and at a same time, a pattern comprising the source and drain electrode is formed. In this way, the auxiliary connection terminal 10 of the touch line 4 is connected with the touch connection terminal 7 through the first connection electrode 5, and the above structure is formed in a same patterning process. This can simplify the fabricating process.

Moreover, the touch line 4 and the auxiliary connection terminal 10 have a tri-layer structure. In an example, the tri-layer structure comprises a stack of a titanium layer, an aluminum layer, and a titanium layer. This tri-layer structure can be formed by a mature process, and the production cost is low.

In step S4, the second insulating layer 9 is formed on the touch line 4. The second insulating layer is provided with the third via 13 and the second via 12 which are arranged concentrically.

As shown in FIG. 5C, in this step, the third via 13 is a tapered hole, and the second via 12 has a maximum aperture smaller than or equal to the minimum aperture of the third via 13. This facilitates forming the connection electrode in the second via 12 and the third via 13 in the subsequent process steps.

FIG. 5C shows a case in which the second via 12 and the third via 13 are concentrically arranged. However, the present disclosure is not limited in this regard, provided that the top opening of the second via 12 at least partially overlaps with the bottom opening of the third via 13 so that an electrically conductive path is formed in the subsequent stage.

In an embodiment, the top opening of the second via 12 is not covered by the second insulating layer 9, so that the top opening of the second via 12 completely falls within the bottom opening of the third via 12. In another embodiment, the top opening of the second via 12 exactly overlaps with the bottom opening of the third via 12.

In step S5, a pattern comprising the common electrode layer 1 is formed on the second insulating layer 9, and the second connection electrode 6 is formed in the second via 12 and the third via 13. The second connection electrode 6 connects the common electrode layer 1 with the touch connection terminal 7.

Figure 5D:
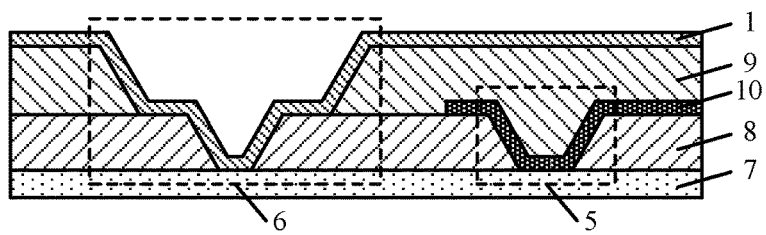

As shown in FIG. 5D, in this step, at a same time a pattern comprising the common electrode layer 1 is formed by a patterning process, the second connection electrode 6 is formed in the second via 12 and the third via 13, so that the common electrode layer 1 is connected with the touch connection terminal 7 through the second connection electrode 6.

In the method for fabricating the array substrate according to the present embodiment, the auxiliary connection terminal 10 of the touch line 4 is connected indirectly with the common electrode layer 1 through the first connection electrode 5, the touch connection terminal 7, and the second connection electrode 6 in this order. Since the touch connection terminal 7 is made from molybdenum, the resistance between the touch line and the common electrode layer 1 is reduced, which avoids defects in display and touch control. Moreover, the touch connection terminal 7 is arranged in a same layer as the gate electrode, and the touch line 4 is arranged in a same layer as the source and drain electrode. Therefore, as compared with the existing method, the number of patterning processes is not increased in the method of the present embodiment, and the production cost is not increased.

Figure 6:
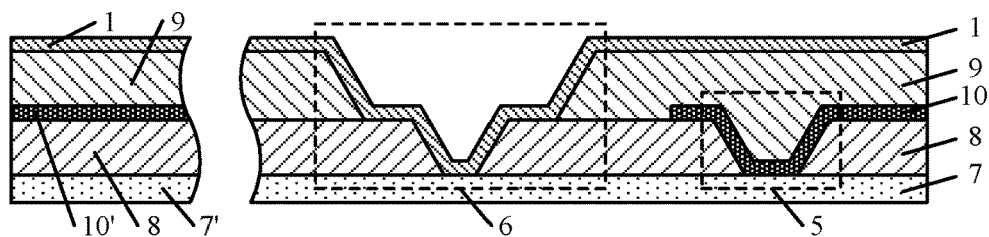
FIG. 6 is a cross-sectional view for illustrating an array substrate in an embodiment of the present disclosure.

FIG. 6 is a cross-sectional view for an array substrate in an embodiment of the present disclosure. The right side of FIG. 6 is identical with and FIG. 5D, and the left side of FIG. 6 shows a thin film transistor region of the array substrate. As shown, the touch connection terminal 7 is arranged in a same layer as the gate electrode 7' of the thin film transistor, and the auxiliary connection terminal 10 (and the touch line 4) is arranged in a same layer as the source and drain electrode 10'. It is noted that only layers and/or components relevant with the inventive concept of the present disclosure are shown in FIG. 6. For example, the source and drain electrode and the gate electrode of the thin film transistor are shown in the thin film transistor region of FIG. 6, while the active layer is not shown.

An embodiment of the present disclosure provides a touch panel comprising the array substrate as described above.

The touch panel can specifically be a FIC capacitive touch panel, and applied to any product or component with a display function like a mobile phone, tablet computer, TV, monitor, notebook computer, digital photo frame, and navigator. The occurrence of defects in display and touch control is avoided. Besides, as compared with the existing touch panel, neither the number of patterning processes nor the production cost is increased.

In the array substrate and the method for fabricating the same according to the present disclosure, the touch line in the array substrate is connected with the common electrode layer through the first and second connection electrode, the first connection electrode is connected with the touch connection terminal, and the second connection electrode is connected with the touch connection terminal connect. As a result, the first connection electrode is connected indirectly with the second connection electrode through the touch connection terminal. As compared with the existing structure in which the common electrode layer is connected directly with the auxiliary connection terminal of the touch line, the array substrate of the present disclosure can significantly reduce the contact resistance between the common electrode layer and the touch line, and effectively avoid defects in display and touch control.

The touch screen of the present disclosure comprises the array substrate as described above, which can significantly reduce the contact resistance between the common electrode layer and the touch line, and effectively avoid defects in display and touch control.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. An array substrate, comprising a thin film transistor, a common electrode layer, a touch line, a touch connection terminal, and a connection electrode,
    wherein the touch connection terminal and the touch line are arranged in different layers,
    wherein the connection electrode comprises a first connection electrode which is arranged in a same layer as the touch line and a second connection electrode which is arranged in a same layer as the common electrode layer, and
    wherein the touch line is connected with the touch connection terminal through the first connection electrode, and the common electrode layer is connected with the touch connection terminal through the second connection electrode,
    wherein the array substrate further comprises an auxiliary connection terminal which extends from a side of the touch line,
        wherein the auxiliary connection terminal is arranged in a same layer as the touch line, the auxiliary connection terminal is connected with the touch connection terminal through the first connection electrode, and the auxiliary connection terminal at least partially overlaps with the touch connection terminal,
    wherein the array substrate further comprises a first insulating layer which is arranged between the common electrode layer and the touch connection terminal and a second insulating layer which is arranged on the first insulating layer,
        wherein the touch line and the auxiliary connection terminal are arranged between the first insulating layer and the second insulating layer,
        wherein the first insulating layer is provided with a first via in a region corresponding with a position where the auxiliary connection terminal and the touch connection terminal overlap, and the first connection electrode is arranged in the first via, and
        wherein the first insulating layer is provided with a second via in a region corresponding with a position where the touch connection terminal and the auxiliary connection terminal do not overlap, the second insulating layer is provided with a third via, the second via at least partially overlaps with the third via, and the second connection electrode is arranged in the second via and the third via.

2. The array substrate of claim 1, wherein the second via and the third via are concentrically arranged.

3. The array substrate of claim 1, wherein the first via, the second via, and the third via are tapered holes, and the tapered holes have an aperture which gradually decreases in a direction away from the touch connection terminal.

4. The array substrate of claim 3, wherein the second via has a maximum aperture smaller than or equal to a minimum aperture of the third via.

5. The array substrate of claim 1, wherein a portion of the touch connection terminal does not overlap with the touch line.

6. The array substrate of claim 1, wherein the touch connection terminal and the touch line do not overlap with each other.

7. The array substrate of claim 1, further comprising a data line, wherein the data line is arranged in a same layer as the touch line, and the data line is arranged in such a manner that it is parallel with and spaced apart from the touch line.

8. The array substrate of claim 1, wherein the thin film transistor comprises a gate electrode, a gate insulating layer, an active layer, and a source and drain electrode which are arranged in this order, and the touch line is arranged in a same layer as the source and drain electrode.

9. The array substrate of claim 8, wherein the touch connection terminal is arranged in a same layer as the gate electrode.

10. The array substrate of claim 9, wherein the touch line and the source and drain electrode have a tri-layer structure which is made from titanium, aluminum, and titanium in this order.

11. The array substrate of claim 9, wherein the gate electrode and the touch connection terminal are made from molybdenum.

12. A touch panel, comprising an array substrate, wherein the array substrate comprises a thin film transistor, a common electrode layer, a touch line, a touch connection terminal, and a connection electrode,
    wherein the touch connection terminal and the touch line are arranged in different layers,
    wherein the connection electrode comprises a first connection electrode which is arranged in a same layer as the touch line and a second connection electrode which is arranged in a same layer as the common electrode layer, and
    wherein the touch line is connected with the touch connection terminal through the first connection electrode, and the common electrode layer is connected with the touch connection terminal through the second connection electrode,
    wherein the array substrate further comprises an auxiliary connection terminal which extends from a side of the touch line,
        wherein the auxiliary connection terminal is arranged in a same layer as the touch line, the auxiliary connection terminal is connected with the touch connection terminal through the first connection electrode, and the auxiliary connection terminal at least partially overlaps with the touch connection terminal,
    wherein the array substrate further comprises a first insulating layer which is arranged between the common electrode layer and the touch connection terminal and a second insulating layer which is arranged on the first insulating layer,
        wherein the touch line and the auxiliary connection terminal are arranged between the first insulating layer and the second insulating layer,
        wherein the first insulating layer is provided with a first via in a region corresponding with a position where the auxiliary connection terminal and the touch connection terminal overlap, and the first connection electrode is arranged in the first via, and wherein the first insulating layer is provided with a second via in a region corresponding with a position where the touch connection terminal and the auxiliary connection terminal do not overlap, the second insulating layer is provided with a third via, the second via at least partially overlaps with the third via, and the second connection electrode is arranged in the second via and the third via.

13. A method for fabricating an array substrate, comprising:

forming a pattern comprising a touch connection terminal;

depositing a first insulating layer on the touch connection terminal, and forming a first via and a second via in the first insulating layer;

forming a pattern comprising a touch line and a first connection electrode on the first insulating layer, wherein the first connection electrode is arranged in the first via;

depositing a second insulating layer on the first insulating layer on which the pattern comprising the touch line and the first connection electrode has been formed, and forming a third via in the second insulating layer, wherein the third via at least partially overlaps with the second via; and forming a pattern comprising a common electrode layer and a second connection electrode on the second insulating layer, wherein the second connection electrode is arranged in the second via and the third via, and the second connection electrode connects the common electrode layer with the touch connection terminal.

14. The method of claim 13, wherein the step of forming the pattern comprising the touch line and the first connection electrode on the first insulating layer further comprises: forming an auxiliary connection terminal which extends from a side of the touch line, wherein an orthographic projection of the auxiliary connection terminal at least partially overlaps with the first via, the auxiliary connection terminal forms a first connection electrode in the first via, and the auxiliary connection terminal is connected with the touch connection terminal through the first connection electrode.

15. The method of claim 13, wherein the step of forming the pattern comprising the touch connection terminal comprises:

forming a pattern comprising the touch connection terminal and a gate electrode in a same patterning process.

16. The method of claim 13, wherein the step of forming the pattern comprising the touch line and the first connection electrode on the first insulating layer comprises:

forming a pattern comprising the touch line, the first connection electrode, and a source and drain electrode in a same patterning process.

17. The method of claim 13, wherein the first via, the second via, and the third via are tapered holes, the tapered holes have an aperture which gradually decreases in a direction away from the touch connection terminal, and the second via has a maximum aperture smaller than or equal to a minimum aperture of the third via.

18. The method of claim 13, wherein the touch line and the source and drain electrode have a tri-layer structure which is made from titanium, aluminum, and titanium in this order, and the touch connection terminal is made from molybdenum.

* * * * *